(12) United States Patent
Chang et al.

(10) Patent No.: US 12,321,675 B2
(45) Date of Patent: Jun. 3, 2025

(54) INCREMENTAL COMPILATION FOR FPGA-BASED SYSTEMS

(71) Applicant: Synopsys, Inc., Mountain View, CA (US)

(72) Inventors: Ying-Tsai Chang, Fremont, CA (US); Kuen-Yang Tsai, Hsinchu (TW); Ryan Zhang, Shanghai (CN); Meng-Chyi Lin, Hsinchu (TW)

(73) Assignee: Synopsys, Inc., Sunnyvale, CA (US)

( * ) Notice: Subject to any disclaimer, the term of this patent is extended or adjusted under 35 U.S.C. 154(b) by 621 days.

(21) Appl. No.: 17/694,542

(22) Filed: Mar. 14, 2022

(65) Prior Publication Data

US 2022/0300690 A1 Sep. 22, 2022

Related U.S. Application Data

(60) Provisional application No. 63/161,894, filed on Mar. 16, 2021.

(51) Int. Cl.
*G06F 30/343* (2020.01)
*G06F 30/333* (2020.01)

(52) U.S. Cl.
CPC .......... *G06F 30/343* (2020.01); *G06F 30/333* (2020.01)

(58) Field of Classification Search
CPC .............................. G06F 30/343; G06F 30/333
USPC ........................................................ 716/100
See application file for complete search history.

(56) References Cited

U.S. PATENT DOCUMENTS

| | | | |
|---|---|---|---|
| 7,290,240 B1* | 10/2007 | Lam-Leventis | G06F 30/398 716/135 |
| 2006/0015313 A1* | 1/2006 | Wang | G06F 30/331 703/14 |
| 2010/0241414 A1* | 9/2010 | Yeh | G06F 30/33 703/14 |
| 2013/0054218 A1* | 2/2013 | Ashraf | G06F 30/33 703/14 |
| 2015/0012903 A1* | 1/2015 | Olgiati | G06F 11/2205 716/136 |
| 2015/0227662 A1* | 8/2015 | Lepercq | G06F 30/34 716/117 |
| 2018/0113976 A1* | 4/2018 | Suresh | G06F 11/2733 |
| 2019/0005177 A1* | 1/2019 | Sharma | G06F 30/331 |
| 2019/0220553 A1* | 7/2019 | Renau | G06F 30/343 |
| 2020/0272701 A1* | 8/2020 | Robertson | G06F 30/3323 |
| 2022/0027181 A1* | 1/2022 | Schkufza | G06F 8/65 |

* cited by examiner

*Primary Examiner* — Jack Chiang
*Assistant Examiner* — Suchin Parihar
(74) *Attorney, Agent, or Firm* — Patterson + Sheridan, LLP (57) ABSTRACT

Embodiments of the present disclosure relate to a system and method for incremental compilation. The method includes identifying a change to a portion of a circuit design. The circuit design without the change was previously compiled to an FPGA. The method also includes configuring a transactor of the FPGA to simulate the portion of the circuit design with the change and configuring the FPGA to use the transactor to simulate the portion of the circuit design with the change.

18 Claims, 7 Drawing Sheets

INCREMENTAL COMPILATION FOR FPGA-BASED SYSTEMS

CROSS-REFERENCE TO RELATED APPLICATIONS

This application claims priority to and the benefit of U.S. Provisional Patent Application Ser. No. 63/161,894, entitled "INCREMENTAL COMPILATION FOR FPGA-BASED SYSTEMS," filed Mar. 16, 2021, which is incorporated herein by reference in its entirety.

TECHNICAL FIELD

The present disclosure relates to field programmable gate array (FPGA)-based emulation and prototyping systems, and more particularly to incremental compilation for FPGA-based systems.

BACKGROUND

Hardware-assisted verification, including emulation and prototyping, is used in very-large-scale integration (VLSI) design verification, specifically to simulate and test circuit designs to ensure that all portions of the circuit designs function properly when provided with different inputs. Three emulation architectures are typically available for use: custom processor-based emulation, custom FPGA-based emulation, and commodity FPGA-based emulation.

Although custom processor-based emulators or FPGA-based emulators have broader adoption due to their ease of design bring-up with faster compile turnaround time, commodity FPGA-based emulators provide better performance and capacity relative to processor-based emulators and FPGA-based emulators. Commodity FPGA-based emulators, however, often have long compile turnaround times (TAT) that increases with larger devices and FPGA system integration.

SUMMARY

Embodiments of the present disclosure relate to a system and method for incremental compilation. According to an embodiment, the method includes identifying a change to a portion of a circuit design. The circuit design without the change was previously compiled to an FPGA. The method also includes configuring a transactor of the FPGA to simulate the portion of the circuit design with the change and configuring the FPGA to use the transactor to simulate the portion of the circuit design with the change.

Configuring the FPGA to use the transactor to simulate the portion of the circuit design with the change may include configuring an input of the portion of the circuit design without the change previously compiled to the FPGA to refer to an input of the transactor and configuring an output of the transactor to refer to an output of the portion of the circuit design without the change previously compiled to the FPGA.

Simulating the portion of the circuit design with the change using the transactor may include detecting, in the transactor, a value change in the portion of the circuit design with the change, stopping a clock of the FPGA based on the detected value change, after stopping the clock, determining an output of the transactor based on the value change, and starting the clock after determining the output of the transactor.

Identifying the change may include comparing a first design file with a second design file, wherein the first design file describes the portion of the circuit design with the change, and wherein the second design file was previously compiled to the FPGA.

The method may include refraining from placing one or more gates of the portion of the circuit design with the change.

The method may include updating a compile database based on the change to the portion of the circuit design.

The method may include testing the circuit design with the change using the FPGA and the transactor.

The method may include configuring a second transactor of a second FPGA to simulate the portion of the circuit design with the change, wherein the circuit design without the change was previously compiled to the second FPGA.

The method may include identifying a second change to a second portion of the circuit design, performing a partial place and route or a partial reconfiguration of the second portion of the circuit design to include the second change, and configuring the FPGA to use the second portion of the circuit design with the second change to process a value change.

According to another embodiment, the system includes an FPGA, a memory, and a processor communicatively coupled to the memory. The processor identifies a change to a portion of a circuit design. The circuit design without the change was previously compiled to the FPGA. The processor also configures a transactor of the FPGA to simulate the portion of the circuit design with the change and configures the FPGA to use the transactor to simulate the portion of the circuit design with the change.

Configuring the FPGA to use the transactor to simulate the portion of the circuit design with the change may include configuring an input of the portion of the circuit design without the change previously compiled to the FPGA to refer to an input of the transactor and configuring an output of the transactor to refer to an output of the portion of the circuit design without the change previously compiled to the FPGA.

Simulating the portion of the circuit design with the change using the transactor may include detecting, in the transactor, a value change in the portion of the circuit design with the change, stopping a clock of the FPGA based on the detected value change, after stopping the clock, determining an output of the transactor based on the value change, and starting the clock after determining the output of the transactor.

Identifying the change may include comparing a first design file with a second design file, wherein the first design file describes the portion of the circuit design with the change, and wherein the second design file was previously compiled to the FPGA.

The processor may refrain from placing one or more gates of the portion of the circuit design with the change.

The processor may update a compile database based on the change to the portion of the circuit design.

The processor may test the circuit design with the change using the FPGA and the transactor.

The system may include a second FPGA. The processor may configure a second transactor of the second FPGA to simulate the portion of the circuit design with the change. The circuit design without the change may have been previously compiled to the second FPGA.

According to another embodiment, a non-transitory computer readable medium stores instructions that, when executed by a processor, causes the processor to perform an operation for simulating a circuit design change. The operation includes comparing a first design file with a second design file to identify a change to a portion of a circuit design. The first design file describes the circuit design with the change, and the second design file describes the circuit design without the change and was previously compiled to an FPGA. The operation also includes configuring a transactor of the FPGA to simulate the portion of the circuit design with the change, configuring an input of the portion of the circuit design without the change previously compiled to the FPGA to refer to an input of the transactor, and configuring an output of the transactor to refer to an output of the portion of the circuit design without the change previously compiled to the FPGA, such that the FPGA uses the transactor to simulate the portion of the circuit design with the change.

Simulating the portion of the circuit design with the change using the transactor may include detecting, in the transactor, a value change in the portion of the circuit design with the change, stopping a clock of the FPGA based on the detected value change, after stopping the clock, determining an output of the transactor based on the value change, and starting the clock after determining the output of the transactor.

The operation may include updating a compile database based on the change to the portion of the circuit design.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a system and method for incremental design change compilation for field programmable gate array (FPGA)-based emulation and prototyping systems. A circuit design is compiled to one or more FPGAs, and the FPGAs are then used to simulate and test the circuit design. For example, various input signals may be provided to the FPGAs to see how the circuit design functions or behaves in response to these input signals. Compiling the circuit design may be a time intensive process.

After testing, one or more changes may be made to the circuit design (e.g., to correct an error or to improve the operation of the circuit design). Compiling the circuit design with the one or more changes may also be a time intensive process, and it may be time-consuming to re-compile the entire circuit design every time a change is made to the circuit design.

This disclosure describes a system and method that performs incremental compilation by simulating the changes to a circuit design without necessarily re-compiling the entire circuit design. Specifically, the FPGA includes a transactor that uses software to simulate the changes to a circuit design. When the circuit design is changed, instead of rec-compiling the entire circuit design, the system identifies the changed portions of the circuit design (e.g., by comparing the changed circuit design with a previous version of the circuit design) and configures the transactor to simulate the operation of the changed portion of the circuit design.

The system then configures the FPGA to use the transactor to simulate the changed portion of the circuit design and to effectively skip over the original version of that portion of the circuit design that was previously compiled to the FPGA. For example, the system may configure an input of the portion of the circuit design in the FPGA to refer to an input of the transactor. The system may also configure an output of the transactor to refer to an output of the portion of the circuit design in the FPGA. As a result, when a signal reaches the portion of the circuit design in the FPGA during testing, instead of sending the signal through the portion of the circuit design in the FPGA, the FPGA sends the signal to the transactor. The transactor simulates in software the response of the changed portion of the circuit design to the signal. The output of the simulation is then provided back to the circuit design in the FPGA to continue the simulation. In this manner, the FPGA simulates the changed circuit design without recompiling the entire circuit design, which saves time.

In some embodiments, the circuit design changes are detected at system register-transfer level (RTL). The detected changes are then simulated by the FPGA transactors so that the changes are effectively implemented directly on prior compilations of the circuit design in the FPGAs without re-compiling the circuit design. Additionally, the transactors control clocks in the FPGAs to allow time for the software simulations to produce outputs. For example, when a transactor detects a value change in a signal, the transactor may stop a clock (e.g., by disabling the clock) of the FPGA while the transactor simulates the effects of the value change in software. When the software provides the new output based on the value change, the transactor outputs the new output to the FPGA and starts the clock (e.g., by enabling the clock).

In some embodiments, by using the transactor to simulate the changed portion of a circuit design, the system avoids a full FPGA fresh compile and replaces system-level netlist processing with a design difference database update and an incremental FPGA place and route for bitstream generation. In this manner, the system reduces compile turnaround time for a set of design changes from tens of hours of compile time to around two hours or below of turnaround time.

Figure 1:
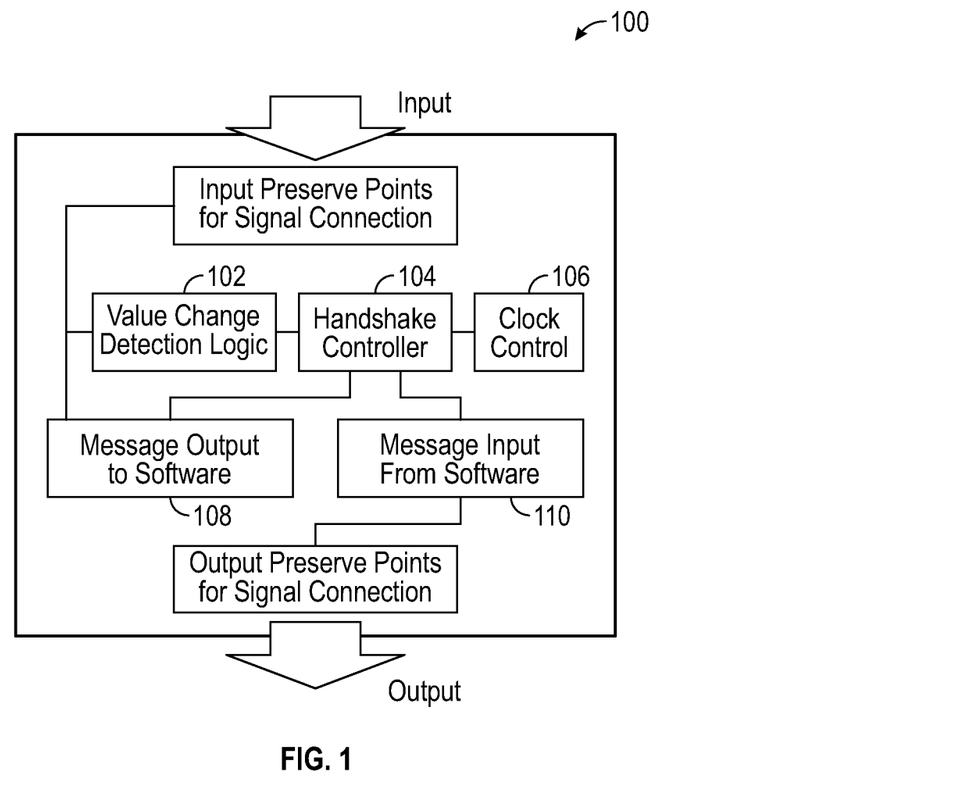
FIG. 1 depicts a transactor according to certain embodiments.

FIG. 1 depicts a transactor 100 according to certain embodiments. As seen in FIG. 1, the transactor 100 includes value change detection logic 102, a handshake controller 104, a clock control 106, message output 108, and message input 110. The transactor 100 simulates changed portions of circuit designs using software to avoid fresh compiles of the changed circuit designs to an FPGA. In this manner, the FPGA can leverage a previous version of the circuit design that was previously compiled to the FPGA and use the transactor 100 to simulate the changed portion of the circuit design when a signal reaches that portion of the circuit design in the FPGA.

The transactor 100 receives as input a signal from the FPGA. The signal may be an input to a portion of a circuit design that is changed and is being simulated by the transactor 100. The input signal may be a logical value that includes any suitable number of bits. The FPGA routes the signal to the transactor 100 instead of through a version of the portion of the circuit design that was previously compiled to the FPGA. The transactor 100 then simulates in software the response of the changed portion of the circuit design to the input signal.

The value change detection logic 102 determines whether there is a value change indicated by the input signal. For example, the value change detection logic 102 may determine whether one or more bits of a logical value of the input signal changes. If the value change detection logic 102 does not detect a value change in the input signal, then the transactor 100 continues to output the same output signal to the FPGA.

When the value change detection logic 102 detects a value change, the transactor 100 prepares to simulate the response of the changed portion of the circuit design to the value change. The handshake controller 104 performs a handshake protocol with a software simulator that simulates the changed portion of the circuit design, and the clock control 106 may stop (e.g., disable) a clock of the FPGA. In this manner, the clock control 106 provides time for the transactor 100 to simulate the response of the changed portion of the circuit design without impacting or affecting the timing in the rest of the circuit design in the FPGA. The message output 108 then communicates a message indicating the value change to the software simulator. The software simulator simulates the response of the changed portion of the circuit design based on the value change and communicates a message back to the transactor 100 indicating the response. The message input 110 receives the message from the software simulator, and the transactor 100 outputs the response to the FPGA. The clock control 106 then starts (e.g., enables) the clock of the FPGA. In this manner, the transactor 100 simulates the behavior and operation of a changed portion of a circuit design so that the circuit design does not need to be re-compiled to an FPGA for testing.

Figure 2:
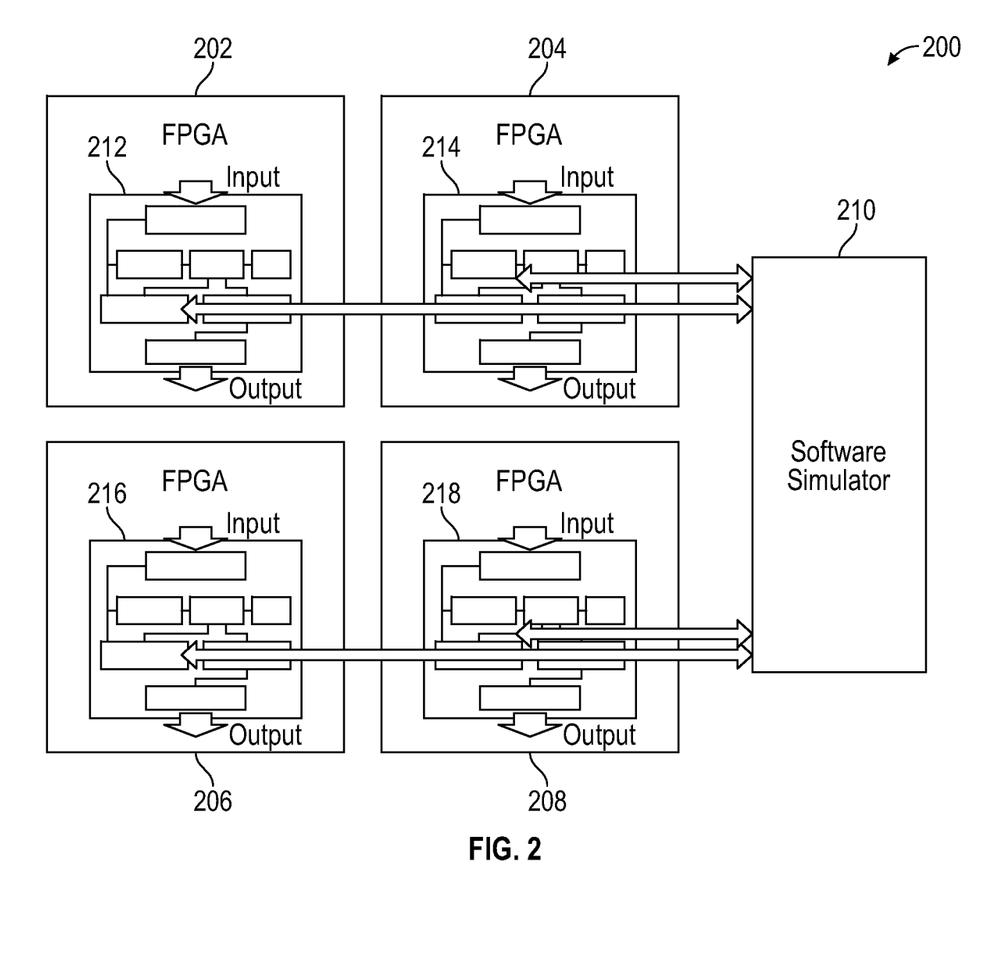
FIG. 2 depicts an infrastructure of field programmable gate arrays (FPGAs) with transactors, according to certain embodiments.

FIG. 2 depicts an infrastructure 200 of FPGAs 202, 204, 206, and 208 with transactors 212, 214, 216, and 218, according to certain embodiments. The infrastructure 200 also includes a software simulator 210. As seen in FIG. 2, each FPGA 202, 204, 206, or 208 includes a transactor 212, 214, 216, or 218. The transactors 212, 214, 216, and 218 may be the same as the transactor 100 shown in FIG. 1. The transactors 212, 214, 216, and 218 simulate the behavior of changed portions of a circuit design. A previous version of the circuit design (e.g., without the changed portions) may have been compiled previously to the FPGAs 202, 204, 206, and 208.

The same circuit design may be compiled to the FPGAs 202, 204, 206, and 208. For example, the circuit design may be compiled to each of the FPGAs 202, 204, 206, and 208. Then the FPGAs 202, 204, 206, and 208 may test the circuit design in parallel with different input signals being sent to the different FPGAs 202, 204, 206, 208. The response of the circuit design to the input signals may then be analyzed to determine if the circuit design responds appropriately to the different input signals. As another example, a circuit design may be compiled across multiple of the FPGAs 202, 204, 206, and 208 (e.g., a circuit design may be compiled across the FPGAs 202 and 204 and across the FPGAs 206 and 208). In such an example, the FPGAs 202 and 204 may operate sequentially to test the circuit design, and the FPGAs 206 and 208 may operate sequentially to test the circuit design.

When the FPGAs 202, 204, 206, and 208 are notified of a portion of the circuit design that was changed, the transactors 212, 214, 216, and 218 are configured so that the FPGAs 202, 204, 206, and 208 route to the transactors 212, 214, 216, and 218 a signal that reach an input of the portion of the circuit design that was previously compiled to the FPGAs 202, 204, 206, and 208. The transactors 212, 214, 216, and 218 then simulate the response of the changed portion of the circuit design to the signal by exchanging messages with the software simulator 210. When the response is ready, the transactors 212, 214, 216, and 218 output the response to an output of the portion of the circuit design that was previously compiled to the FPGAs 202, 204, 206, and 208. In this manner, the FPGAs 202, 204, 206, and 208 use the transactors 212, 214, 216, and 218 to simulate the changed portion of the circuit design instead of re-compiling the circuit design with the changes to the FPGAs 202, 204, 206, and 208.

The software simulator 210 is configured to simulate the changed portion of the circuit design in software. For example, the software simulator 210 may use software to simulate the components of the circuit design (e.g., gates, registers, flops, etc.), which does not require a fresh compile of the circuit design. When a transactor 212, 214, 216, or 218 communicates a message indicating a value change to the software simulator 210, the software simulator 210 simulates the response of components of the circuit design to the value change. The simulator 210 then communicates a message back to the transactor 212, 214, 216, or 218 indicating the response.

Figure 3:
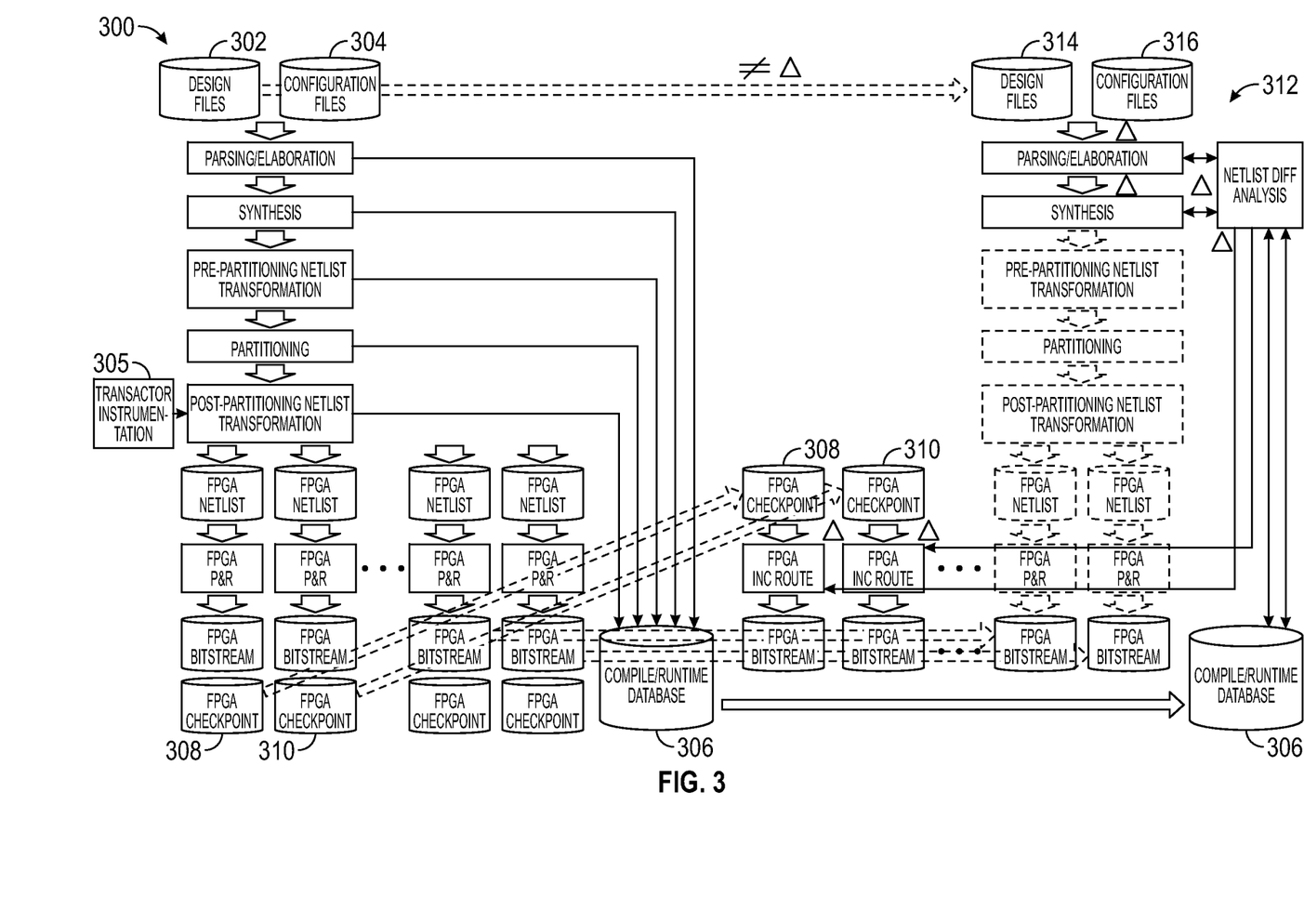
FIG. 3 depicts a compilation process, according to certain embodiments.

FIG. 3 depicts a compilation process 300 and an incremental compilation process 312, according to certain embodiments. As seen in FIG. 3, the compilation process 300 begins with design files 302 and configuration files 304 that describe a circuit design. The design files 302 and the configuration files 304 are then processed using conventional compilation steps (e.g., parsing/elaboration, synthesis, pre-partitioning netlist transformation, partitioning, and post-partitioning netlist transformation) to produce netlists for the FPGAs. During this baseline compile, transactor instrumentation 305 is added to the FPGAs. In some embodiments, a transactor is added to each FPGA. Adding the transactors during the compilation process 300 allows the incremental compilation process 312 to be performed and for the transactors to be used during the incremental compilation process 312.

Information from these compilation steps are written or stored in a compile/runtime database 306 for later use. FPGA placement and routing are then performed to place circuit components and to set the routing between the components in each FPGA. FPGA bitstreams and FPGA checkpoints are then generated for each FPGA. A transactor may also have been added to each FPGA to enable incremental compilation.

A change (represented by Δ) is then made to a portion of the circuit design. New design files 314 and new configuration files 316 may be provided that include the change (Δ). In some embodiments, changes may be made to the design files 302 and to the configuration files 304 to produce the new design files 314 and the new configuration files 316. Instead of re-compiling the new design files 314 and the new configuration files 316, the incremental compilation process 312 may be performed. First, a change (Δ) is determined by comparing the new design files 314 with the design files 302. Identified differences between the new design files 314 and the design files 302 indicate the change (Δ). During the parsing/elaboration and the synthesis steps, the change (Δ) is determined and mapped to changes to the FPGA netlists (e.g., using register mapping, structural netlist isomorphism analysis, fanin/fanout cone analysis, or equivalence checking techniques).

The FPGAs affected by the change may then be determined (e.g., based on identified differences in the netlist caused by the change (Δ)). For example, the FPGAs that implement or simulate the portion of the circuit design that received the change in the new design files 314 may be identified. FPGA compilation checkpoints for these FPGAs are then reconfigured to create FPGA bitstream to simulate the changed portion using a transactor. In the example of FIG. 3, the FPGA checkpoints 308 and 310 are identified as being affected by the change to the portion of the circuit design.

Incremental routing is then performed for these FPGA checkpoints 308 and 310 to configure the corresponding FPGAs to route signals at an input of the portion of the circuit design in the FPGA checkpoint 308 or 310 to a transactor. The output of the transactor is also configured to route signals to an output of the portion of the circuit design in the FPGA checkpoint 308 or 310. As a result, when the signal reaches the portion of the circuit design, the FPGA routes that signal to a transactor (e.g., to simulate the change (Δ)) rather than let the signal continue through the portion of the circuit design without the change (Δ) (e.g., which was previously compiled to the FPGA during the compilation process 300). When the transactor completes simulating the response of the portion of the circuit design with the change (Δ), the transactor routes the output to the output of the portion of the circuit design in the FPGA. In this manner, the FPGAs use the transactors to simulate the change (Δ), which avoids the need to re-compile the circuit design.

In some embodiments, the incremental routing may be done in parallel for all affected FPGAs, so that compile turnaround time for this operation is insensitive to design scale or the number of affected FPGAs. Overall processing time may be determined by the FPGA incremental routing or bit stream generation that takes the longest time, and so the overall processing time is relatively insensitive to design sizes and the number of affected FPGAs.

As seen in the example of FIG. 3, the incremental compilation process 312 skips entire steps in the compilation process (e.g., the pre-partitioning netlist transformation step, the partitioning step, and the post-partitioning netlist transformation step) shown with dashed lines. Additionally, FPGA placement need not be performed for any of the FPGAs. Moreover, FPGA routing need not be performed for FPGAs that are unaffected by the change (Δ) to the circuit design (e.g., shown with dashed lines). For FPGAs that are affected by the change (Δ), only incremental routing (e.g., to configure the routing to and from the transactor) need be performed.

The compile/runtime database 306 may be updated with information from the incremental compilation process 312 (e.g., the updated netlist). Besides FPGA image changes, the database 306 may also be updated with value change processing information, performance timing calculation, and other application database updates (e.g., debug information). In some embodiments, an application database update could be achieved with incremental in-memory runtime updates of needed changes by attaching a revision database without a full regeneration of the database, which reduces processing time.

In some embodiments, software side processing (e.g., in the software simulator 210 shown in FIG. 2) of needed value change operations from all FPGAs has the benefit of simplifying FPGA hardware side netlist editing, which reduces the time it takes to edit the FPGA netlist by moving logic operations to the software side. Furthermore, software side processing of design changes may also process cross-FPGA operations easily (e.g., by cross-FPGA signal force assign).

In certain embodiments, intra-FPGA value change processing is achieved purely on the hardware side within the FPGA by FPGA netlist editing, by using an in-FPGA programmable circuit evaluation processor, or by partially reconfiguring the circuit to achieve certain circuit operations, without needing to send to software (e.g., the software simulator 210) for better performance. A value change detector could stop a clock to introduce an additional infrastructure cycle to simplify the timing calculation for hardware side changes.

In some embodiments, the compilation process 300 and the incremental compilation process 312 effectively open up a new FPGA system compilation paradigm. The compile turnaround time for the incremental compile involves the incremental database update. The full baseline compile may be periodically refreshed as a background cronjob (e.g., jobs on a repeating schedule) baseline compile, which has less of a direct impact on a user's intra-day design bug fix validation iteration usage.

Figure 4:
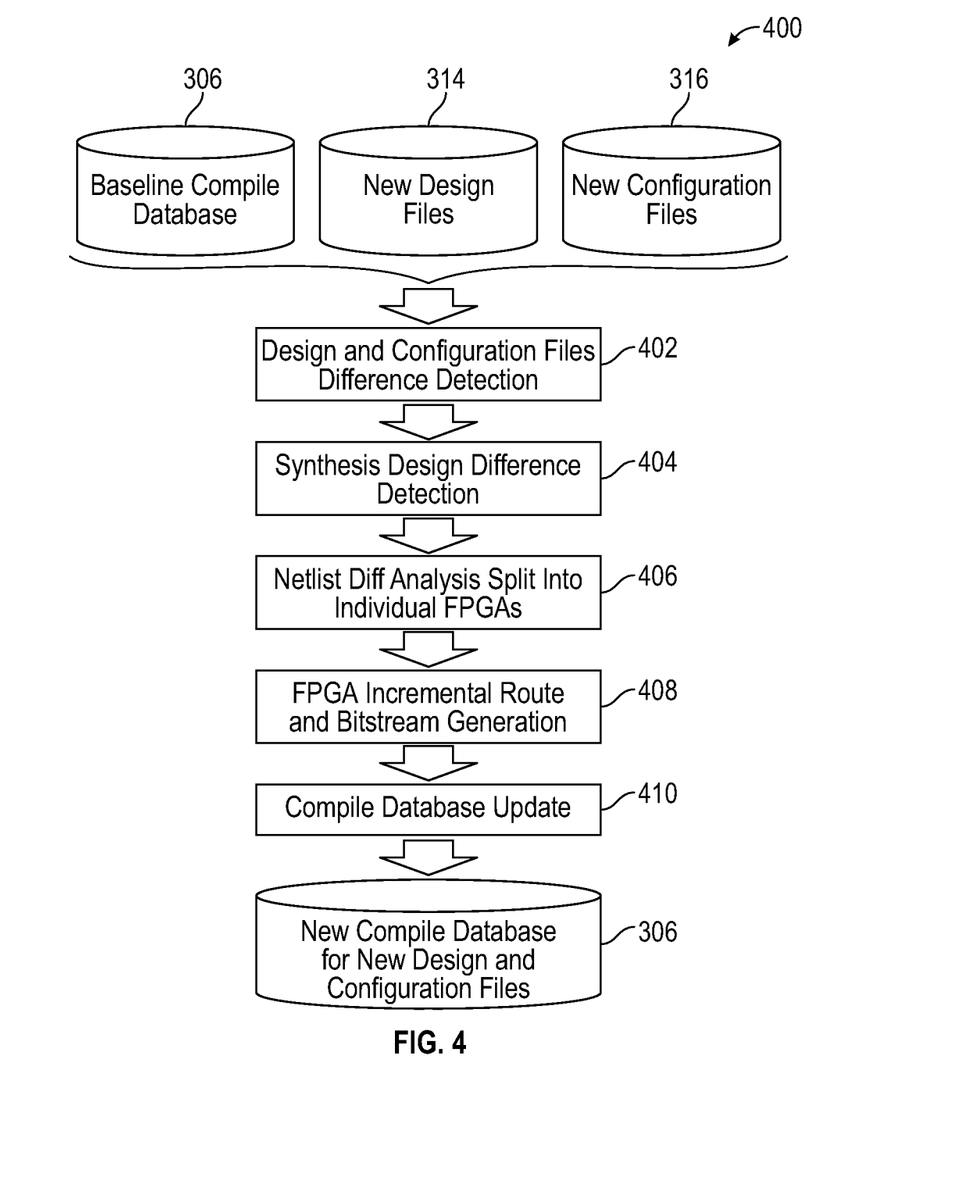
FIG. 4 depicts a flow diagram for an incremental compilation process, according to certain embodiments.

FIG. 4 depicts a flow diagram for an incremental compilation process 400, according to certain embodiments. The process 400 uses the baseline compile database 306, new design files 314, and new configuration files 316. The baseline compile database 306 may include information from the baseline compile. For example, compilation steps may be added into the baseline compilation flow to add needed compilation information and infrastructure implementation, according to certain embodiments. Original compilation design (e.g., original design files) and configuration information (e.g., original configuration files) may be stored in the database 306 for incremental compile comparison. FPGA compilation checkpoints may be stored to enable incremental FPGA place and route. The compilation database 306 could also record optional FPGA partition mapping information to accelerate change mapping into FPGAs in the incremental compilation.

In 402, differences between the new design files 314 and design files used during the baseline compile are determined. Additionally, differences between the new configuration files 316 and the configuration files used during the baseline compile are determined. These differences may indicate one or more changes that are being made to one or more portions of a circuit design. In 404 (synthesis), these differences are used to determine the one or more changes that are being made to the one or more portions of the circuit design. Based on the differences in the new design files 314 and the new configuration files 316, a partial or full synthesis of the netlist is performed for comparison with the baseline compile netlist to identify design difference. In some embodiments, this step may be skipped if RTL source file difference identification is sufficient for value change processing simulation.

In 406 (netlist difference analysis), one or more FPGAs affected by the one or more changes to the circuit design are determined. For example, during the baseline compile, the one or more portions of the circuit design that have now been changed may have been compiled into these FPGAs. In some embodiments, during this step, identified netlist differences are mapped per FPGA using mechanisms such as register mapping, structural analysis, recorded partitioning information, or equivalence checking.

Incremental routing is then performed for the affected FPGAs in 408. For example, the FPGAs are configured so that signals to the one or more portions of the circuit design are instead routed to transactors that simulate the portions of these portions of the circuit design with the changes. The inputs to the portions of the circuit design may be configured to instead refer to the transactors. The outputs of the transactors are then configured to refer to the outputs of the portions of the circuit design implemented in the FPGAs. As a result, after the transactors have simulated the response of the changed portions of the circuit design, the transactors communicate the simulation output to the outputs of the portions of the circuit design implemented in the FPGAs. In this manner, the FPGAs effectively route signals around the portions of the circuit design and to the transactors for software simulation, which allows the FPGAs to simulate the new circuit design without performing a full compile. In some embodiments, during this step, an FPGA netlist difference is transformed into a netlist editing command for each FPGA to perform incremental place and route on an FPGA checkpoint to perform needed changes and to generate bitstream into a new compilation database. Incremental placement may be optional, for example, occurring only when incremental routing is needed in a transactor-based implementation for signal connection into the input/output of the transactors.

In 410, the compile database 306 is updated with the information from the incremental compile. For example, the compile database 306 may include the new design files 314 and the new configuration files 316.

Figure 5:
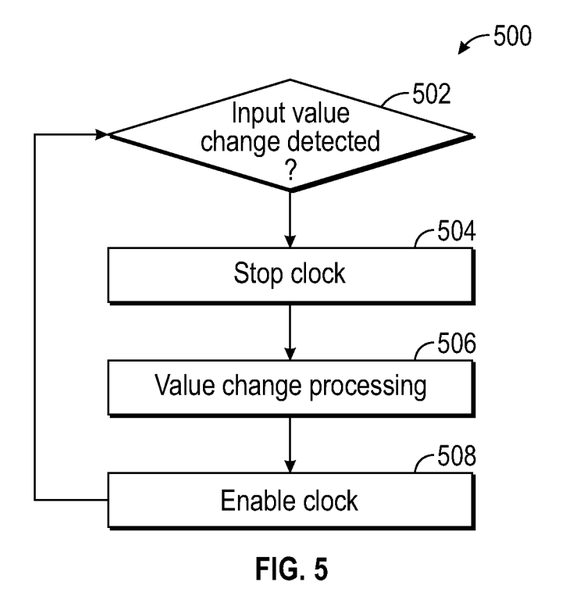
FIG. 5 depicts a run time flow during emulation, according to certain embodiments.

FIG. 5 depicts a run time flow 500 during emulation, according to certain embodiments. In some embodiments, a transactor 100 performs the flow 500. In 502, the transactor 100 detects a value change at an input of the transactor 100 (e.g., using value change detection logic 102). For example, the transactor 100 may detect a change in one or more bits of a logical value of the input signal.

If the transactor 100 detects a value change, the transactor stops a clock in 504. For example, the transactor 100 may use a clock control 106 to disable a clock of an FPGA (e.g., the FPGA that includes the transactor 100). By stopping the clock, the transactor 100 provides time to simulate the response of a changed portion of a circuit design to the value change.

In 506, the transactor 100 processes the value change. For example, the transactor 100 may use a handshake controller 104 to communicate messages with a software simulator 210. The messages may indicate the value change. The software simulator 210 may simulate the response of the changed portion of the circuit design to the value change. The software simulator 210 then provides the response to the transactor 100. The transactor 100 then outputs the response.

In some embodiments, communication to the software simulator 210 may be optional for value change processing done at the hardware side (e.g., such as difference circuit implemented with partial place and route or partial reconfiguration). Rather than communicating the value change to the software simulator 210 to determine the response of the changed portion of the circuit design to the value change, the hardware in the FPGA that has been updated using partial place and route or partial reconfiguration processes the value change and provides the response, which may provide better performance even though the design change scale may be more limited.

Figure 6:
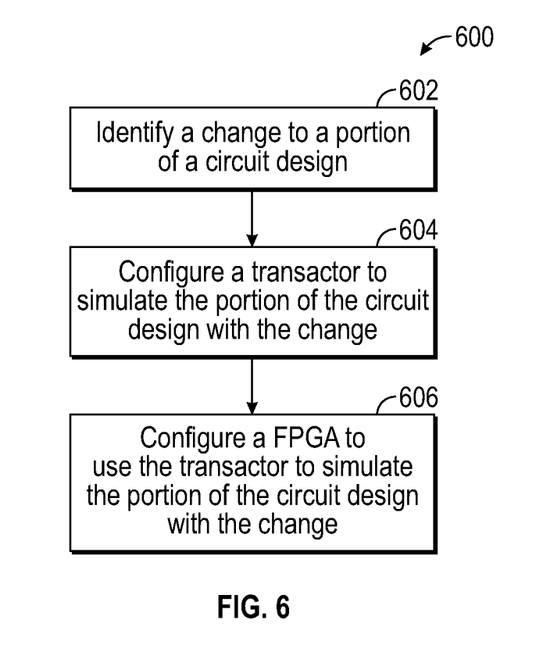
FIG. 6 depicts a method for incremental compilation for FPGA-based systems, according to certain embodiments.

In 508, the transactor 100 enables the clock. For example, the transactor may use the clock control 106 to enable the clock of the FPGA. By starting the clock, the transactor 100 signals that the output is ready and that the FPGA may continue operation using the output of the transactor 100. In some embodiments, the value change detection and stop/enable clock steps may be optional if timing analysis assures that signal value change propagation during emulation could be settled within a period of specified emulation frequency FIG. 6 depicts a method 600 for incremental compilation for FPGA-based systems, according to certain embodiments. At 602, a change to a portion of a circuit design is identified. For example, new design files 314 may be compared with old design files 302 to determine a difference between the new design files 314 and the old design files 302. New configuration files 316 may be compared with old configuration files 304 to determine a difference between the new configuration files 316 and the old configuration files 304. During a synthesis step, these differences may be used to determine a change to a portion of a circuit design.

In 604, a transactor 100 is configured to simulate the portion of the circuit design with the change. The transactor 100 may include a handshake controller 104 and a clock control 106 that allow the transactor 100 to exchange messages with a software simulator 210 to simulate the portion of the circuit design with the change. When the transactor 100 detects a value change in an input to the portion of the circuit design, the transactor 100 communicates a message to the software simulator 210 indicating the change. The software simulator 210 may include software code that simulates the portion of the circuit design with the change. The software simulator 210 simulates the response of the portion of the circuit design with the change to the value change and communicates a message back to the transactor 100 indicating the response.

In 606, the FPGA is configured to use the transactor 100 to simulate the portion of the circuit design with the change. For example, an input to the portion of the circuit design that was previously compiled to an FPGA may be set to refer to an input of the transactor 100. Additionally, an output of the transactor 100 may be set to refer to an output of the portion of the circuit design that was previously compiled to the FPGA. In this manner, the FPGA routes signals at the input of the portion of the circuit design that was previously compiled to the FPGA to the transactor 100, and the transactor 100 routes its output to the output of the portion of the circuit design that was previously compiled to the FPGA.

Figure 7:
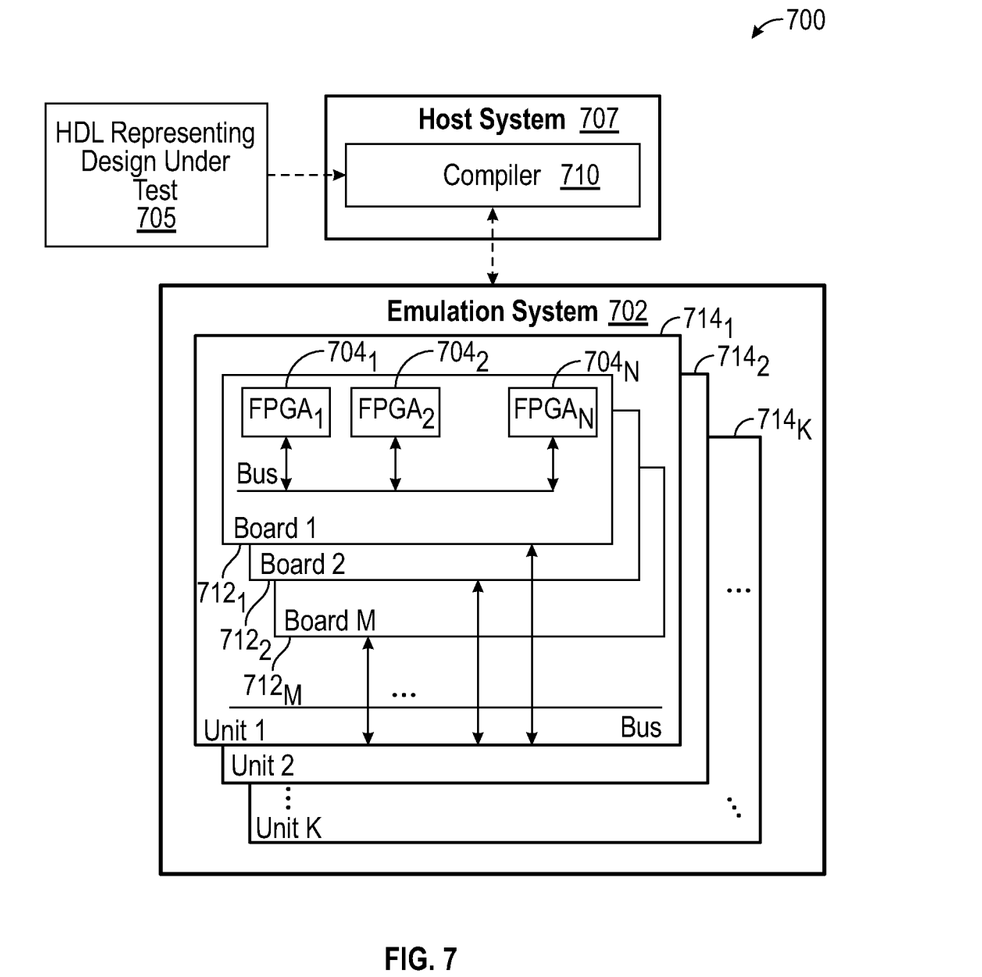
FIG. 7 depicts a diagram of an example emulation system in accordance with some embodiments of the present disclosure.

FIG. 7 depicts a diagram of an example emulation environment 700. An emulation environment 700 may be configured to verify the functionality of the circuit design. The emulation environment 700 may include a host system 707 (e.g., a computer that is part of an Electronic Design Automation (EDA) system) and an emulation system 702 (e.g., a set of programmable devices such as Field Programmable Gate Arrays (FPGAs) or processors). The host system generates data and information by using a compiler 710 to structure the emulation system to emulate a circuit design. A circuit design to be emulated is also referred to as a Design Under Test ('DUT'), where data and information from the emulation are used to verify the functionality of the DUT.

The host system 707 may include one or more processors. In the embodiment where the host system includes multiple processors, the functions described herein as being performed by the host system can be distributed among the multiple processors. The host system 707 may include a compiler 710 to transform specifications written in a description language that represents a DUT and to produce data (e.g., binary data) and information that is used to structure the emulation system 702 to emulate the DUT. The compiler 710 can transform, change, restructure, add new functions to, and/or control the timing of the DUT.

The host system 707 and emulation system 702 exchange data and information using signals carried by an emulation connection. The connection can be but is not limited to, one or more electrical cables such as cables with pin structures compatible with the Recommended Standard 232 (RS232), universal serial bus (USB) protocols, PCIe, or other protocols capable of providing for communication of data. The connection can be a wired communication medium or network such as a local area network or a wide area network such as the Internet. The connection can be a wireless communication medium or a network with one or more points of access using a wireless protocol such as BLUETOOTH or IEEE 702.11. The host system 707 and emulation system 702 can exchange data and information through a third device such as a network server.

The emulation system 702 includes multiple FPGAs (or other modules) such as FPGAs $704_1$ and $704_2$ as well as additional FPGAs to $704_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 702 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $704_1$-$704_N$ may be placed onto one or more boards $712_1$ and $712_2$, as well as additional boards through $712_M$. Multiple boards can be placed into an emulation unit $714_1$. The boards within an emulation unit can be connected using the backplane of the emulation unit or any other type of connection. In addition, multiple emulation units (e.g., $714_1$ and $714_2$ through $714_K$) can be connected to each other by cables or any other means to form a multi-emulation unit system.

For a DUT that is to be emulated, the host system 707 transmits one or more bit files to the emulation system 702. The bit files may specify a description of the DUT and may further specify partitions of the DUT created by the host system 707 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 707 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate-level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT, which includes interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by the logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 707 and/or the compiler 710 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 705 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 8:
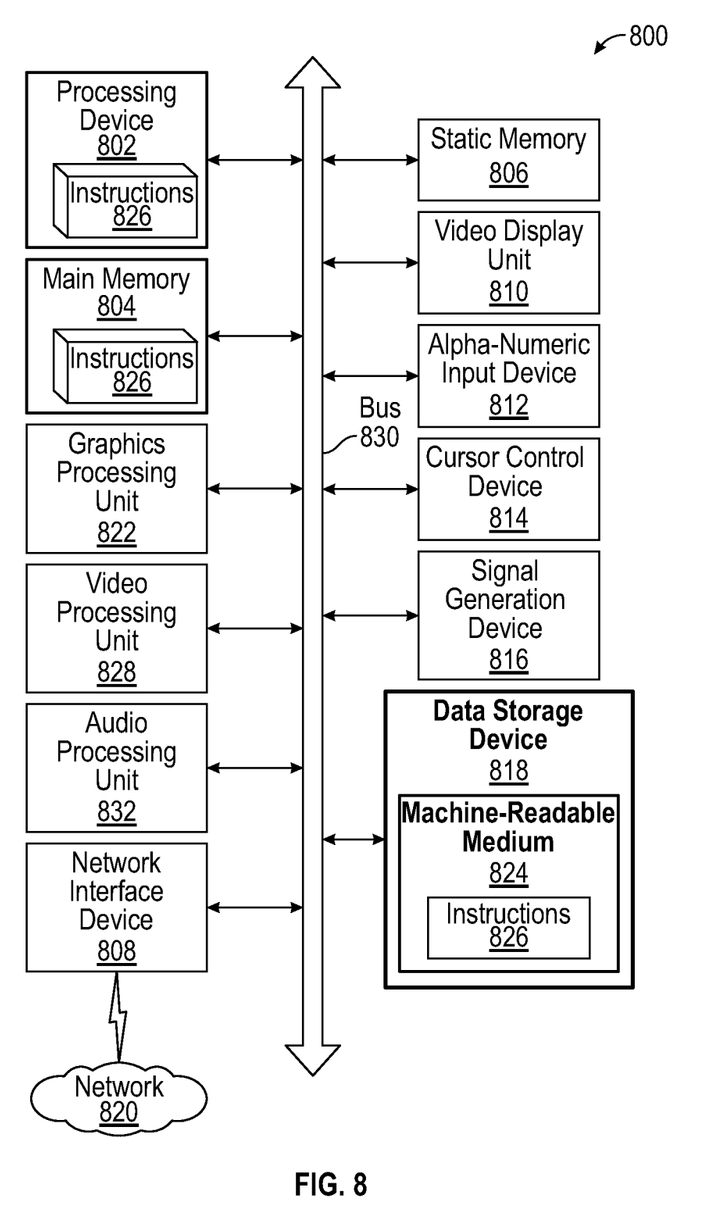
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for incremental compilation, the method comprising:
   identifying a change to a portion of a circuit design, wherein the circuit design without the change was previously compiled to a field programmable gate array (FPGA);
   configuring a transactor of the FPGA to simulate the portion of the circuit design with the change;
   configuring an input of the portion of the circuit design without the change previously compiled to the FPGA to refer to the transactor such that the FPGA routes, to the transactor, a signal that reaches the input; and
   configuring the transactor to refer to an output of the portion of the circuit design without the change previously compiled to the FPGA such that the transactor routes, to the output of the portion of the circuit design without the change previously compiled to the FPGA, a response of the portion of the circuit design with the change to the signal.

2. The method of claim 1, wherein simulating the portion of the circuit design with the change using the transactor comprises:
   detecting, in the transactor, a value change in the portion of the circuit design with the change;
   stopping a clock of the FPGA based on the detected value change;
   after stopping the clock, determining an output of the transactor based on the value change; and
   starting the clock after determining the output of the transactor.

3. The method of claim 1, wherein identifying the change comprises comparing a first design file with a second design file, wherein the first design file describes the portion of the circuit design with the change, and wherein the second design file was previously compiled to the FPGA.

4. The method of claim 1, further comprising refraining from placing one or more gates of the portion of the circuit design with the change.

5. The method of claim 1, further comprising updating a compile database based on the change to the portion of the circuit design.

6. The method of claim 1, further comprising testing the circuit design with the change using the FPGA and the transactor.

7. The method of claim 1, further comprising configuring a second transactor of a second FPGA to simulate the portion of the circuit design with the change, wherein the circuit design without the change was previously compiled to the second FPGA.

8. The method of claim 1, further comprising:
   identifying a second change to a second portion of the circuit design;
   performing a partial place and route or a partial reconfiguration of the second portion of the circuit design to include the second change; and
   configuring the FPGA to use the second portion of the circuit design with the second change to process a value change.

9. A system for incremental compilation, the system comprising:
   an FPGA;
   a memory; and
   a processor communicatively coupled to the memory, the processor configured to:
      identify a change to a portion of a circuit design, wherein the circuit design without the change was previously compiled to the FPGA;
      configure a transactor of the FPGA to simulate the portion of the circuit design with the change;
      configuring an input of the portion of the circuit design without the change previously compiled to the FPGA to refer to the transactor such that the FPGA routes, to the transactor, a signal that reaches the input; and configuring the transactor to refer to an output of the portion of the circuit design without the change previously compiled to the FPGA such that the transactor routes, to the output of the portion of the circuit design without the change previously compiled to the FPGA, a response of the portion of the circuit design with the change to the signal.

10. The system of claim 9, wherein simulating the portion of the circuit design with the change using the transactor comprises:

detecting, in the transactor, a value change in the portion of the circuit design with the change;

stopping a clock of the FPGA based on the detected value change;

after stopping the clock, determining an output of the transactor based on the value change; and starting the clock after determining the output of the transactor.

11. The system of claim 9, wherein identifying the change comprises comparing a first design file with a second design file, wherein the first design file describes the portion of the circuit design with the change, and wherein the second design file was previously compiled to the FPGA.

12. The system of claim 9, wherein the processor is further configured to refrain from placing one or more gates of the portion of the circuit design with the change.

13. The system of claim 9, wherein the processor is further configured to update a compile database based on the change to the portion of the circuit design.

14. The system of claim 9, wherein the processor is further configured to test the circuit design with the change using the FPGA and the transactor.

15. The system of claim 9, further comprising a second FPGA, wherein the processor is further configured to configure a second transactor of the second FPGA to simulate the portion of the circuit design with the change, wherein the circuit design without the change was previously compiled to the second FPGA.

16. A non-transitory computer readable medium storing instructions that, when executed by a processor, causes the processor to perform an operation for incremental compilation, the operation comprising:

comparing a first design file with a second design file to identify a change to a portion of a circuit design, wherein the first design file describes the circuit design with the change, and wherein the second design file describes the circuit design without the change and was previously compiled to an FPGA;

configuring a transactor of the FPGA to simulate the portion of the circuit design with the change;

configuring an input of the portion of the circuit design without the change previously compiled to the FPGA to refer to the transactor such that the FPGA routes, to the transactor, a signal that reaches the input; and configuring an output of the transactor to refer to an output of the portion of the circuit design without the change previously compiled to the FPGA such that the transactor routes, to the output of the portion of the circuit design without the change previously compiled to the FPGA, a response of the portion of the circuit design with the change to the signal.

17. The medium of claim 16, wherein simulating the portion of the circuit design with the change using the transactor comprises:

detecting, in the transactor, a value change in the portion of the circuit design with the change;

stopping a clock of the FPGA based on the detected value change;

after stopping the clock, determining an output of the transactor based on the value change; and starting the clock after determining the output of the transactor.

18. The medium of claim 16, the operation further comprising updating a compile database based on the change to the portion of the circuit design.

* * * * *